United States Patent
Ko et al.

(10) Patent No.: US 9,614,190 B2
(45) Date of Patent: Apr. 4, 2017

(54) FLEXIBLE DISPLAY DEVICE AND MANUFACTURING METHOD THEREOF

(75) Inventors: Moo-Soon Ko, Yongin (KR); Il-Jeong Lee, Yongin (KR); Choong-Youl Im, Yongin (KR); Jong-Hyuk Lee, Yongin (KR); Sung-Chul Kim, Yongin (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 361 days.

(21) Appl. No.: 13/097,456

(22) Filed: Apr. 29, 2011

(65) Prior Publication Data

US 2012/0228617 A1   Sep. 13, 2012

(30) Foreign Application Priority Data

Mar. 10, 2011 (KR) .................. 10-2011-0021423
Apr. 20, 2011 (KR) .................. 10-2011-0036862

(51) Int. Cl.
*H01L 21/00* (2006.01)
*H01L 51/52* (2006.01)
*H01L 51/00* (2006.01)

(52) U.S. Cl.
CPC ........ *H01L 51/529* (2013.01); *H01L 51/0097* (2013.01); *H01L 2227/326* (2013.01); *Y02E 10/549* (2013.01)

(58) Field of Classification Search
CPC .. H01L 27/1214; H01L 27/12; H01L 33/0079
USPC ........ 438/149, 22, 28, 99, 458, 648; 219/50, 219/200, 209, 228; 257/40, 59
See application file for complete search history.

(56) References Cited

U.S. PATENT DOCUMENTS

| | | | | |
|---|---|---|---|---|
| 5,039,208 A | * | 8/1991 | Ohnishi | C09K 19/38 252/299.01 |
| 5,152,480 A | * | 10/1992 | Adams | B64D 15/12 244/134 D |
| 5,177,363 A | * | 1/1993 | Velbeck et al. | 250/337 |
| 6,521,511 B1 | * | 2/2003 | Inoue | H01L 21/2007 257/E21.122 |
| RE38,024 E | * | 3/2003 | Adams | B64D 15/163 244/134 A |
| 6,946,178 B2 | * | 9/2005 | Sheats | B32B 7/06 206/724 |
| 2001/0042734 A1 | * | 11/2001 | Beilin et al. | 216/38 |
| 2002/0050220 A1 | * | 5/2002 | Schueller et al. | 101/486 |
| 2002/0058279 A1 | * | 5/2002 | Fritsch et al. | 435/6 |

(Continued)

FOREIGN PATENT DOCUMENTS

| | | |
|---|---|---|
| CN | 1347269 A | 5/2002 |
| CN | 1745197 A | 3/2006 |

(Continued)

*Primary Examiner* — Lex Malsawma
*Assistant Examiner* — Eric Jones
(74) *Attorney, Agent, or Firm* — Lee & Morse, P.C.

(57) ABSTRACT

A method for manufacturing a flexible display device includes forming a heat generator on a carrier substrate, forming a flexible substrate on the heat generator, forming a thin film transistor on the flexible substrate, forming a light emitting element connected to the thin film transistor, and separating the flexible substrate from the heat generator by application of heat to the flexible substrate, the application of heat including generation of heat by the heat generator.

19 Claims, 19 Drawing Sheets
(5 of 19 Drawing Sheet(s) Filed in Color)

(56) References Cited

U.S. PATENT DOCUMENTS

| | | | |
|---|---|---|---|
| 2003/0032210 A1* | 2/2003 | Takayama et al. | 438/30 |
| 2003/0077642 A1* | 4/2003 | Fritsch et al. | 435/6 |
| 2004/0035840 A1* | 2/2004 | Koopmans | H01L 23/345 219/209 |
| 2004/0121146 A1* | 6/2004 | He et al. | 428/332 |
| 2004/0235267 A1* | 11/2004 | Sheats et al. | 438/455 |
| 2006/0292938 A1* | 12/2006 | Schwenke et al. | 439/876 |
| 2007/0075823 A1* | 4/2007 | Sugiyama | 338/22 R |
| 2007/0184292 A1* | 8/2007 | Lee et al. | 428/475.5 |
| 2007/0196999 A1* | 8/2007 | Tamura et al. | 438/458 |
| 2008/0220509 A1* | 9/2008 | Segawa et al. | 435/287.2 |
| 2008/0280417 A1* | 11/2008 | Yamazaki | H01L 21/3081 438/433 |
| 2009/0261414 A1* | 10/2009 | Oikawa | H01L 21/568 257/347 |
| 2009/0269874 A1* | 10/2009 | Huang et al. | 438/34 |
| 2010/0203296 A1* | 8/2010 | Tsai | H01L 21/6835 428/172 |
| 2011/0193067 A1* | 8/2011 | Lee | H01L 51/5256 257/40 |

FOREIGN PATENT DOCUMENTS

| | | | |
|---|---|---|---|
| CN | 101067025 A | 11/2007 | |
| CN | 101484988 A | 7/2009 | |
| CN | 101728420 A | 6/2010 | |
| EP | 1 191 819 A2 | 9/2001 | |
| EP | 1 191 819 A2 | 3/2002 | |
| JP | 2005-353426 A | 12/2005 | |
| JP | 2006-088538 A | 4/2006 | |
| JP | 2008-102378 A | 5/2008 | |
| JP | 2009-111400 A | 5/2009 | |
| KR | 10-2004-0041977 A | 5/2004 | |
| KR | 10-2008-0004067 A | 1/2008 | |
| KR | 10-2009-0095026 A | 9/2009 | |
| KR | 10-2010-0068661 A | 6/2010 | |
| SG | WO-01/29114 A1 * | 4/2001 | C08G 73/10 |
| TW | 558743 B | 10/2003 | |
| TW | 200816462 A | 4/2008 | |
| WO | WO 2006/011664 A1 | 2/2006 | |
| WO | WO 2008-005979 A1 | 1/2008 | |

\* cited by examiner

FLEXIBLE DISPLAY DEVICE AND MANUFACTURING METHOD THEREOF

BACKGROUND

1. Field

The described technology relates generally to a display device. More particularly, the described technology relates generally to a flexible display device and a manufacturing method thereof.

2. Description of the Related Art

The display device market has changed through the introduction of flat panel displays (FPDs) that easily realize a large area and exhibit reduced weight and thickness. For example, among many kinds of FPDs, the organic light emitting diode (OLED) display exhibits reduced thickness and weight due to its self-luminescent characteristics, i.e., no requirement of a light source.

The conventional FPD may include a glass substrate, so its flexibility is reduced and it has limitations in application. Further, the conventional FPD may include a thin film transistor on its substrate to control the same.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a method for manufacturing a flexible display device, so a thin film transistor may be prevented from being damaged when a flexible substrate and a carrier substrate are separated, and so processing costs may be reduced to allow a quick detachment in a large area condition.

An exemplary embodiment provides a method for manufacturing a flexible display device, including forming a heat generator on a carrier substrate, forming a flexible substrate on the heat generator, forming a thin film transistor on the flexible substrate, forming a light emitting element connected to the thin film transistor, and separating the flexible substrate from the heat generator by application of heat to the flexible substrate, the application of heat including generation of heat by the heat generator.

Forming the flexible substrate may include forming a single layer on the heat generator.

Separating the flexible substrate from the heat generator may include applying heat that provides an interface temperature between the heat generator and the flexible substrate that is greater than a melting point of the flexible substrate.

Forming the flexible substrate may include forming a flexible substrate with an initial thickness, and forming the heat generator includes forming a heat generator transmitting heat to the flexible substrate.

Forming the flexible substrate may include forming a sacrificial layer on the heat generator, forming a water vapor permeation preventing layer on the sacrificial layer, and forming a main body layer on the water vapor permeation preventing layer.

Separating the sacrificial layer from the heat generator may include applying heat that provides an interface temperature between the heat generator and the sacrificial layer that is greater than a melting point of the sacrificial layer.

A flexible display device may be manufactured by the method above, an outer part of the flexible substrate having a root mean squared roughness in a range from about 1 nm to about 15 nm.

An exemplary embodiment provides another method for manufacturing a flexible display device, including forming a heat generator on a carrier substrate, the heat generator including a conducting material with a predetermined resistance, forming a flexible substrate on the heat generator, forming a driving circuit including a thin film transistor on the flexible substrate, forming a light emitting element and an encapsulation member on the driving circuit, generating Joule's heat by applying a voltage to the heat generator, the generated Joule's heat being applied to the flexible substrate to separate the flexible substrate from the heat generator.

Forming the heat generator may include depositing at least one of a metal and a metal oxide to a uniform thickness on the carrier substrate.

Generating the Joule's heat may include applying to the heat generator voltage with a pulse waveform.

Forming the flexible substrate may include forming a single layer on the heat generator, such that a predetermined part of the single layer contacting the heat generator is decomposed by the Joule's heat of the heat generator.

The flexible substrate may include at least one of polyimide, polycarbonate, polyacrylate, polyetherimide, polyethersulphone, polyethylene terephthalate, and polyethylene naphthalate.

Generating the Joule's heat may include heating the heat generator to a temperature of about 300° C. to about 900° C.

Forming the flexible substrate may include forming a flexible substrate with an initial thickness, and forming the heat generator includes forming a heat generator transmitting heat to the flexible substrate.

Forming the flexible substrate may include forming a sacrificial layer on the heat generator, forming a water vapor permeation preventing layer on the sacrificial layer, and forming a main body layer on the water vapor permeation preventing layer.

The sacrificial layer may be formed to be thinner than the main body layer, at least a part of the sacrificial layer being decomposed by the Joule's heat of the heat generator so the water vapor permeation preventing layer and the main body layer are separated from the heat generator.

The sacrificial layer may be formed of at least one of polyimide, polycarbonate, polyacrylate, polyetherimide, polyethersulphone, polyethylene terephthalate, and polyethylene naphthalate.

The Joule heating temperature of the heat generator may be within the range of about 300° C. to about 900° C.

A flexible display device manufactured by the above method, an outer part of the flexible substrate having a root mean squared roughness of about 1 nm to about 15 nm.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

The above and other features and advantages will become more apparent to those of ordinary skill in the art by describing in detail exemplary embodiments with reference to the attached drawings, in which.

DETAILED DESCRIPTION

Figure 1:
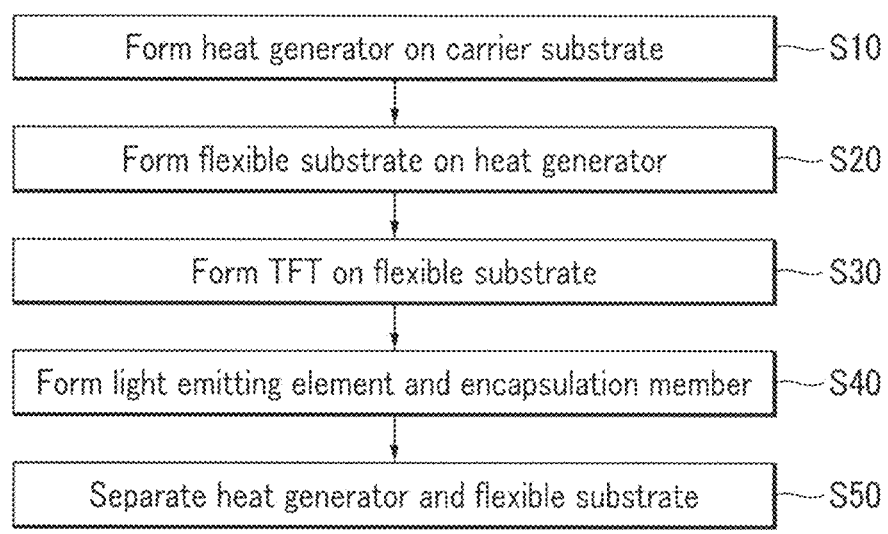
FIG. 1 illustrates a flowchart of a method for manufacturing a flexible display device according to an exemplary embodiment.

Korean Patent Application No. 10-2011-0021423, filed on Mar. 10, 2011, in the Korean Intellectual Property Office, and entitled: "Flexible Display Device and Manufacturing Method Thereof," and Korean Patent Application No. 10-2011-0036862, filed on Apr. 20, 2011, in the Korean Intellectual Property Office, are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a flowchart of a method for manufacturing a flexible display device according to an exemplary embodiment. Referring to FIG. 1, the method for manufacturing a flexible display device may include forming a heat generator on a carrier substrate (operation S10), forming a flexible substrate on the heat generator (operation S20), forming a thin film transistor (TFT) on the flexible substrate (operation S30), forming a light emitting element and an encapsulation member (operation S40), and separating the flexible substrate from the heat generator and the carrier substrate by using heat generated by the heat generator (operation S50).

Figure 2A:
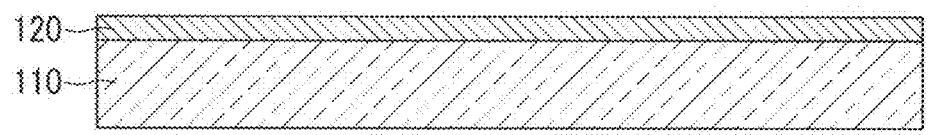
FIG. 2A to FIG. 2E illustrate cross-sectional views of stages in a method for manufacturing a flexible display device according to an exemplary embodiment.
Figure 2B:
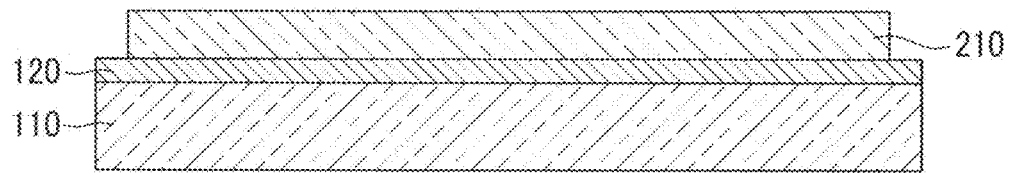
Figure 2C:
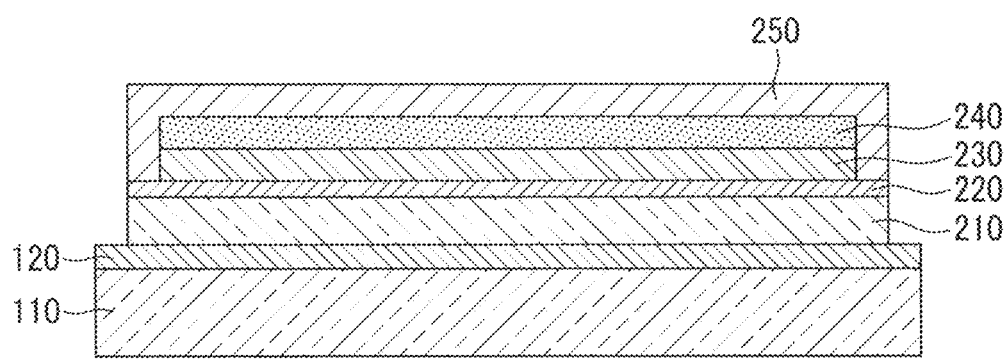
Figure 2D:
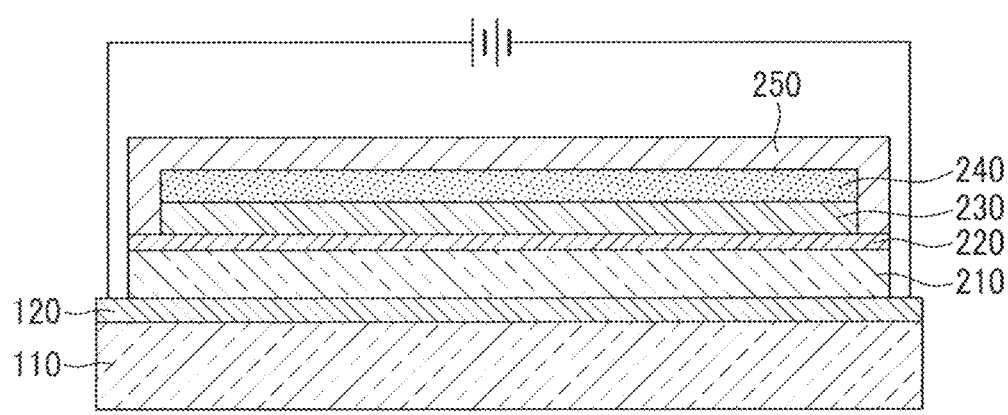
Figure 2E:
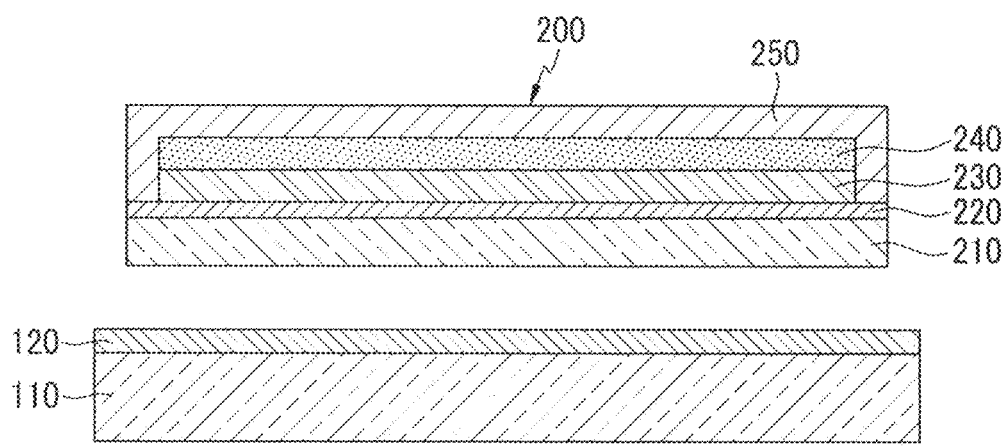
Figure 2F:
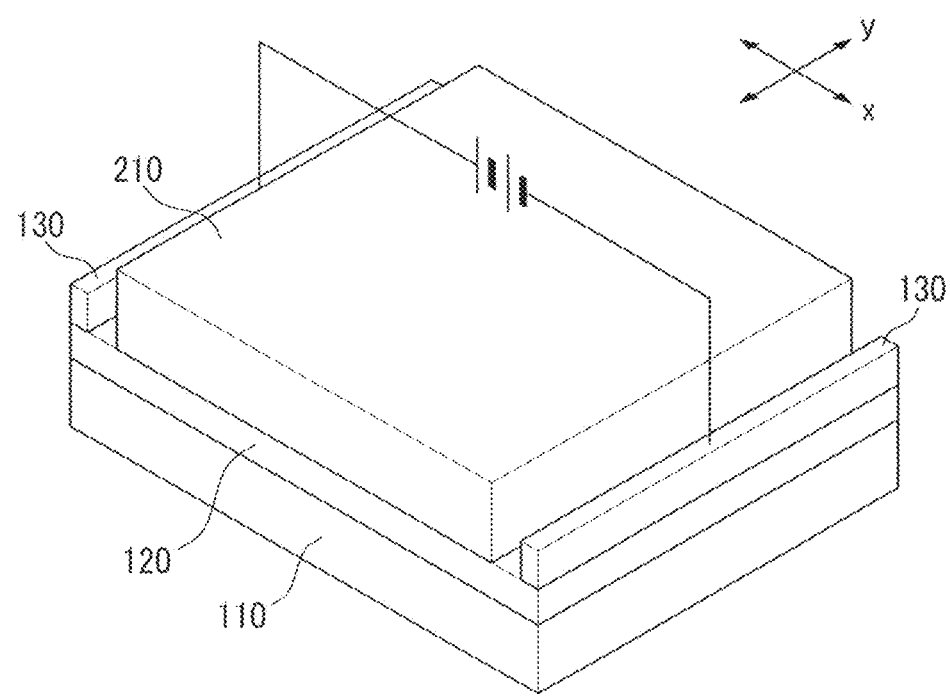
FIG. 2F illustrates a partial perspective view of FIG. 2D.

FIG. 2A to FIG. 2E illustrate cross-sectional views of stages in a first method for manufacturing a flexible display device shown in FIG. 1, and FIG. 2F illustrates a partial perspective view of FIG. 2D. A method for manufacturing a flexible display device according to a first exemplary embodiment will now be described with reference to FIG. 1 and FIGS. 2A-2F.

Referring to FIG. 2A, in operation S10, a carrier substrate 110 may be prepared, and a heat generator 120 may be formed on the carrier substrate 110. The carrier substrate 110 may be a glass substrate as a hard insulation substrate. The heat generator 120 generates heat in a predetermined condition. The heat generator 120 may be formed on the carrier substrate 110 to function as a surface heating member.

Referring to FIG. 2B, in operation S20, a flexible substrate 210 may be formed on, e.g., directly on, the heat generator 120. For example, the flexible substrate 210 may be a plastic film, and may be manufactured by coating a liquid polymer material on, e.g., directly on, the heat generator 120, followed by heat curing the coated liquid polymer material. For example, the flexible substrate 210 may be formed of at least one of polyimide, polycarbonate, polyacrylate, polyetherimide, polyethersulphone, polyethylene terephthalate, and polyethylene naphthalate. For example, the polyimide is usable at a process temperature greater than 450° C., thereby minimizing deterioration of a thin film transistor on the flexible substrate 210 during manufacturing.

It is noted that as the flexible substrate 210, which is made of a plastic film, may be bent or extended by heat, it may be difficult to form a precise thin film pattern configured with a thin film transistor, a light emitting element, and/or a conductive wire on the flexible substrate 210. Therefore, the flexible substrate 210 may be formed on the carrier substrate 110, so the carrier substrate 110 may provide sufficient support for the flexible substrate 210 during subsequent processes, e.g., during formation of a thin film transistor on the flexible substrate 210.

The flexible substrate 210 may be configured with a single layer, and may be formed on the heat generator 120 to contact the heat generator 120. For example, the flexible substrate 210 may be smaller than the heat generator 120, so edges of the heat generator 120 may extend beyond the flexible substrate 210, e.g., along an entire perimeter of the flexible substrate 210.

Referring to FIG. 2C, in operation S30, a barrier layer 220 may be formed on the flexible substrate 210, and a driving circuit 230 including the thin film transistor may be formed on the barrier layer 220, e.g., the barrier layer 220 may be between the flexible substrate 210 and the driving circuit 230. For convenience of illustration, the driving circuit 230 is simply shown to be a single layer in FIG. 2C, e.g., an actual driving circuit may include a plurality of thin film transistors and a plurality of capacitors. A plurality of conductive wires may be formed on the flexible substrate 210.

As further illustrated in FIG. 2C, in operation S40, a light emitting element 240 may be formed on the driving circuit 230, and an encapsulation member 250 may be formed on the light emitting element 240. The light emitting element 240 may include a plurality of organic light emitting elements. The light emitting element 240 may be controllable by the driving circuit 230, and may display an image by emitting light according to a driving signal. FIG. 2C simplifies the light emitting element 240 as a single layer for ease of description.

The barrier layer 220 may be formed of an inorganic layer and/or an organic layer, or of stacked inorganic and organic layers. The barrier layer 220 suppresses permeation of undesired elements, e.g., moisture or oxygen, into the light emitting element 240 through the flexible substrate 210, as moisture or oxygen may deteriorate the light emitting element 240 and reduce life-span of the light emitting element 240.

The encapsulation member 250 may be formed of multiple layers. The encapsulation member 250 may be formed of a plurality of inorganic layers, a plurality of inorganic layers, and/or a plurality of alternately stacked organic and inorganic layers. The inorganic layer may include, e.g., aluminum oxide and/or silicon oxide, and the organic layer may include, e.g., epoxy, acrylate, and/or urethaneacrylate.

The inorganic layer prevents the outer moisture and oxygen from permeating into the light emitting element 240. The organic layer weakens inner stress of the inorganic layer or fills minute cracks and pinholes of the inorganic layer. The materials of the inorganic layer and the organic layer are examples and are not restricted as the described materials, and various kinds of inorganic layers and organic layers known to a person skilled in the art are usable.

The encapsulation member 250 may surround a side of the driving circuit 230 and a side of the light emitting element 240, so that the sides of the driving circuit 230 and the light emitting element 240 may not be exposed to the outside. In other words, the encapsulation member 250 may contact, e.g., directly contact, the barrier layer 220 with the driving circuit 230 and the light emitting element 240 therebetween.

Referring to FIG. 2D, in operation S50, the heat generator 120 may generate heat and apply the generated heat to the flexible substrate 210. As a result of the applied heat, a predetermined region of the flexible substrate 210 contacting the heat generator 120, i.e., a bottom region in the drawing, may be decomposed by thermal energy, so the flexible substrate 210 may be separated from the heat generator 120 and the carrier substrate 110 (FIG. 2E). That is, the heat generator 120 may function as a thermal energy source contacting the flexible substrate 210, e.g., directly contacting an entire bottom surface of the flexible substrate 210 facing the heat generator 120, so the thermal energy of the heat generator 120 may be transferred directly to the flexible substrate 210 without a medium.

In contrast, if a flexible substrate on a carrier substrate is heated by a laser source, e.g., as opposed to the heat generator 120 of the exemplary embodiment, laser beams, e.g., excimer laser beams, may be irradiated toward the flexible substrate from a region outside the carrier substrate trough the carrier substrate in order to transmit thermal energy to the flexible substrate. That is, a laser source may be positioned externally with respect to the carrier substrate, e.g., beyond a bottom surface of the carrier substrate facing away from the flexible substrate, so the laser beam output by the laser source passes through the thickness of the carrier substrate in order to reach and be focused on the flexible substrate, thereby transmitting the thermal energy to the flexible substrate. Accordingly, as opposed to the heat generator 120, i.e., a heat source contacting the flexible substrate 210 and being located inside the structure of the carrier substrate 110 with the flexible substrate 210, a laser source at outer parts of the substrate carrier require a medium, i.e., the substrate carrier, in order to transfer energy.

For example, the heat generator 120 may be configured with, e.g., may include, a conductive layer for causing Joule heating in a voltage applying condition. However, a configuration of the heat generator 120 and a principle for the same to generate heat are not restricted to the above-described example, and other configurations for instantly generating heat and thermally decomposing a part of the flexible substrate 210 are applicable.

The heat generator 120 may include a metal or a metal oxide. For example, the heat generator 120 may include at least one of molybdenum (Mo), titanium (Ti), copper (Cu), silver (Ag), and chromium (Cr) as a metal, and/or at least one of indium tin oxide (ITO) and indium zinc oxide (IZO) as a metal oxide.

Referring to FIG. 2F, the carrier substrate 110 and the heat generator 120 may be formed to have an area that is greater than an area of the flexible substrate 210, so that ends of the heat generator 120, e.g., portions of an upper surface of the heat generator 120 facing the flexible substrate 210 on two opposite edges of the heat generator 120, may be exposed to an outer part of the flexible substrate 210. Two pads 130 connected to an external power supply (not shown) may contact the exposed ends of the heat generator 120 to apply voltage, e.g., with a pulse waveform, to the heat generator 120.

The exposed ends of the heat generator 120 and the two pads 130 thereon may face each other along a direction of the carrier substrate 110, e.g., along the x-axis in the drawing, and may be formed in a shape of a long rod in the crossing direction, e.g., the pads 130 may extend along an entire length of the heat generator 120 and its exposed ends along the y-axis. Accordingly, as the pads 130 contact opposite ends of the heat generator 120, a uniform current flows through the heat generator 120 in one direction, e.g., along the x-axis direction in the drawing, of the carrier substrate 110, thereby causing generation of Joule's heat in the heat generator 120.

The heat generator 120 generates heat at various temperatures in accordance with resistance values and pulse conditions, e.g., the heat generator 120 may generate heat greater than 1000° C. The temperature of the heat generator 120 may be set to be within a range that is appropriate for controlling heat to quickly pass through a predetermined part of the flexible substrate 210 and instantly decompose the predetermined part to a predetermined heat penetration depth without affecting the driving circuit 230 and the light emitting element 240 formed on the flexible substrate 210. For example, the heating temperature of the heat generator 120 in operation S50 may be set to be in a range of about 300° C. to about 900° C. When the heating temperature of the heat generator 120 is lower than 300° C., thermal decomposition in the bottom area of the flexible substrate 210 may be non-uniform, e.g., insufficient material may decompose, thereby making the decomposition of the flexible substrate 210 difficult. When the heating temperature of the heat generator 120 is higher than 900° C., the flexible substrate 210 may overheat, thereby causing deterioration of the thin film transistor formed on the flexible substrate 210.

The heat generator 120 may be formed with a uniform thickness on the carrier substrate 110 to generate uniform Joule's heat over the whole heat generator 120.

A pulse period of the voltage applied to the heat generator 120 may be controlled in consideration of the heat penetration depth of the flexible substrate 210. When the thickness of the flexible substrate 210 is about 10 μm, the heat penetration thickness of the flexible substrate 210 is about 10 μm, the heat penetration depth can be less than about 1 μm. In this case, deterioration of the driving circuit 230 and the light emitting element 240 caused by the heat provided to the flexible substrate 210 may be substantially minimized.

The above-described separation process according to the exemplary embodiment may be referred to as the Joule heating induced lift-off (JILO) process. In the present exemplary embodiment using the JILO process, Joule's heat is generated by applying voltage to the heat generator 120. As the heat generator 120 contacts a predetermined area of the flexible substrate 210, Joule's heat transferred from the heat generator 120 to the predetermined area of the flexible substrate 210 penetrates the flexible substrate 210 to a predetermined depth, e.g., in accordance with voltage pulse period as discussed previously. A portion of the flexible substrate 210 penetrated by the heat decomposes, e.g., an entire contact surface between the flexible substrate 210 and the heat generator 120, so the flexible substrate 210 is separated from the heat generator 120. The separation process may also be performed with a wide and/or large substrate within several microseconds (μs), and imparts little or no thermal and/or mechanical damage to the driving circuit 230 and the light emitting element 240 on the flexible substrate 210.

In contrast, when a laser beam is used for a separation process, the driving circuit and the light emitting element may be damaged due to the laser's intensity, since the flexible substrate and the layers formed thereon are very thin despite control of the laser beams intensity and focal depth. Further, use of the laser may increase costs due to expenses of a laser system, and may increase production time since there are a limited number of usable laser beams, and the laser beams have to be scanned.

Figure 3A:
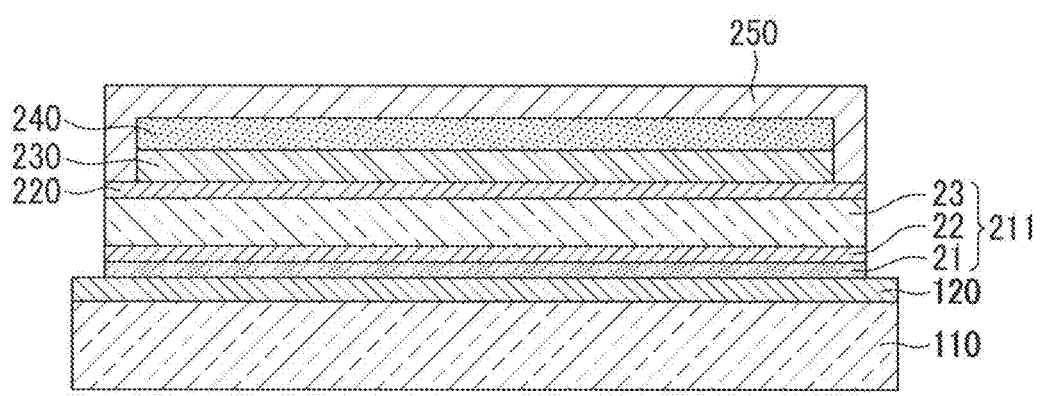
FIG. 3A to FIG. 3C illustrate cross-sectional views of stages in a method for manufacturing a flexible display device according to another exemplary embodiment.
Figure 3B:
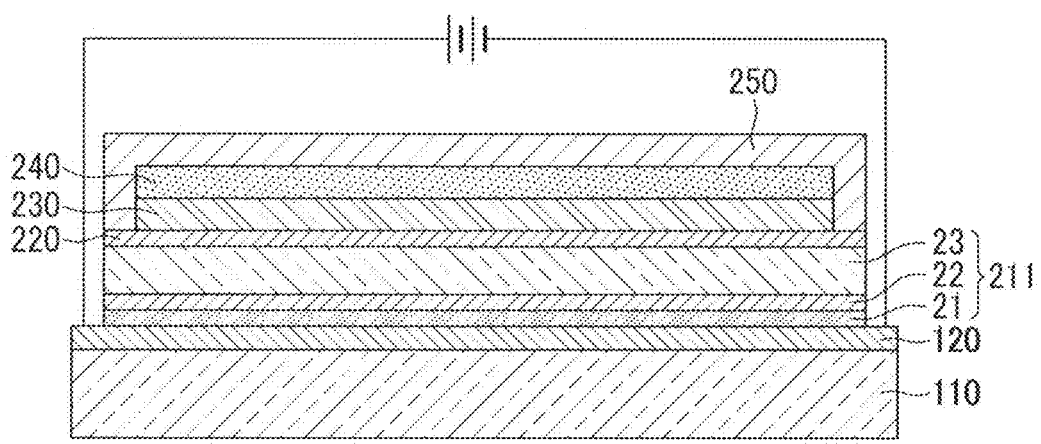
Figure 3C:
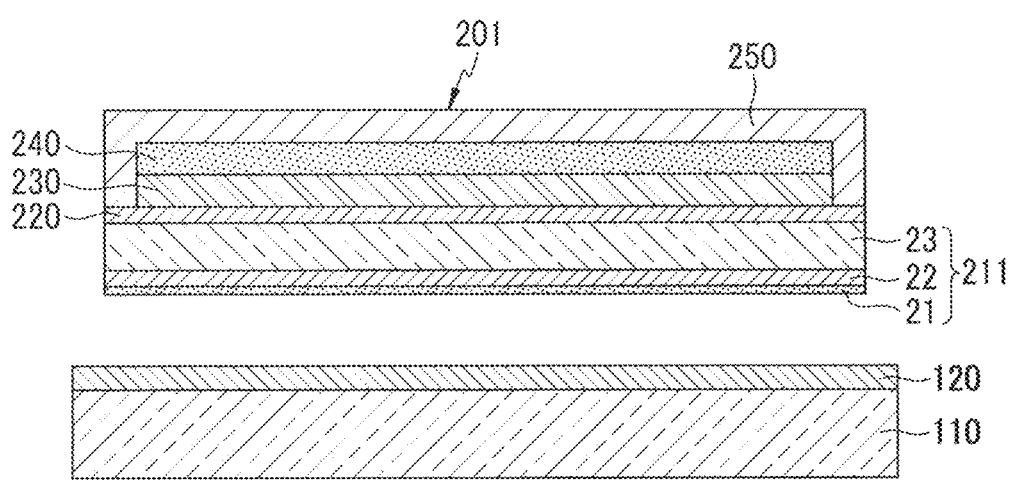

FIG. 3A to FIG. 3C illustrate cross-sectional views of stages in a second method for manufacturing a flexible display device shown in FIG. 1. A method for manufacturing a flexible display device according to a second exemplary embodiment will now be described with reference to FIG. 1 and FIGS. 3A-3C.

Referring to FIG. 3A, in operation S10, the carrier substrate 110 may be prepared, and the heat generator 120 may be formed on the carrier substrate 110 in a like manner of the first exemplary embodiment (FIG. 2A). In operation S20, a flexible substrate 211 may be formed on the heat generator 120 by sequentially depositing a sacrificial layer 21, a water vapor permeation preventing layer 22, and a main body layer 23 on, e.g., directly on, the heat generator 120. In other words, the flexible substrate 211 may include multiple layers, i.e., the flexible substrate 211 may include the sacrificial layer 21, the water vapor permeation preventing layer 22, and the main body layer 23. The sacrificial layer 21 may be formed on, e.g., directly on, the heat generator 120 to contact the heat generator 120.

The sacrificial layer 21 and the main body layer 23 may be made of a same plastic film as the flexible substrate 210 of the first exemplary embodiment, and the plastic film may be manufactured by coating a liquid polymer material followed by thermal hardening. For example, the sacrificial layer 21 may be formed to be less thick than the main body layer 23, e.g., the thickness of the sacrificial layer 21 may be equal to or higher than the heat penetration depth of the flexible substrate 210. The main body layer 23 may be formed to have the same thickness as the flexible substrate 210 of the first exemplary embodiment.

The water vapor permeation preventing layer 22 may include at least one of aluminum (Al), molybdenum (Mo), titanium (Ti), copper (Cu), silver (Ag), and chromium (Cr) as a metallic layer, and it may be formed through sputtering. The water vapor permeation preventing layer 22 controls outer moisture from passing through the flexible substrate 211 and permeating into the light emitting element 240. That is, in the second exemplary embodiment, both the barrier layer 220 and the water vapor permeation preventing layer 22 suppress moisture and oxygen permeation into the light emitting element 240, thereby increasing blocking efficiency of the moisture and oxygen.

As described previously with reference to FIG. 2C, the barrier layer 220 and the driving circuit 230 may be formed on the flexible substrate 211 in operation S30. The light emitting element 240 and the encapsulation member 250 may be formed on the driving circuit 230 in operation S40, which correspond to the first exemplary embodiment.

Referring to FIG. 3B and FIG. 3C, in operation S50, voltage is applied to the heat generator 120 to generate Joule's heat. A part of or all of the sacrificial layer 21 contacting the heat generator 120 may be thermally decomposed by the Joule's heat, and the water vapor permeation preventing layer 22 of the flexible substrate 211 may be separated from the heat generator 120 to complete a flexible display device 201. A part of the sacrificial layer 21 that is not thermally decomposed may or may not remain on the surface of the water vapor permeation preventing layer 22. Resistance, heating temperature, and pulse condition of the heat generator 120 correspond to, i.e., are the same as, those of the first exemplary embodiment.

EXAMPLES

An exemplary process for manufacturing a flexible display device according to a first exemplary embodiment and a thermal conductivity simulation result will now be described.

A glass substrate is used for the carrier substrate 110, and the heat generator 120 configured with a single layer of molybdenum (Mo) is formed on the glass substrate. A polyimide film is used for the flexible substrate 210. The polyimide film is about 10 μm thick and is hardened at a temperature higher than 350° C. Processes after the polyimide film is formed correspond to those of the general OLED display. A voltage with a pulse waveform is applied to the heat generator 120 to perform the thermal conductivity simulation.

Figure 4:
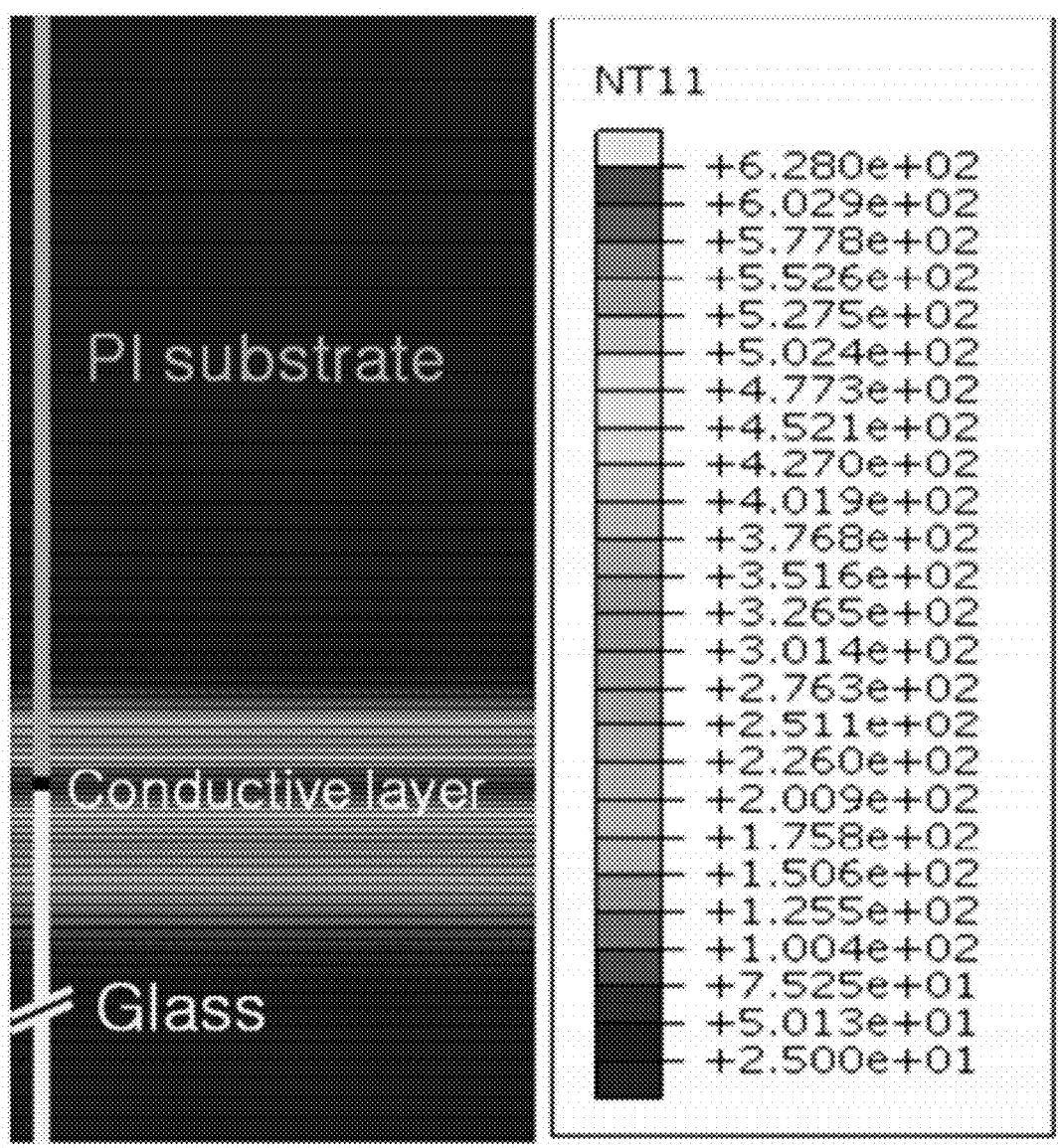
FIG. 4 illustrates a heat distribution simulation result that is measured when a voltage is applied to a heat generator.

FIG. 4 shows a heat distribution simulation result that is measured when a voltage is applied to the heat generator. In FIG. 4, "PI substrate" is the polyimide film, i.e., the flexible substrate, "conductive layer" is the heat generator, and "Glass" is a glass substrate as the carrier substrate.

Referring to FIG. 4, the maximum temperature of the heat generator is 600° C., and the interface temperature between the polyimide film and the heat generator is 450° C., which is higher than the melting point of the polyimide film (360° C.). Hence, a part of the polyimide film is decomposed by the heat so the polyimide film, i.e., the flexible substrate, is separated from the heat generator.

Figure 5:
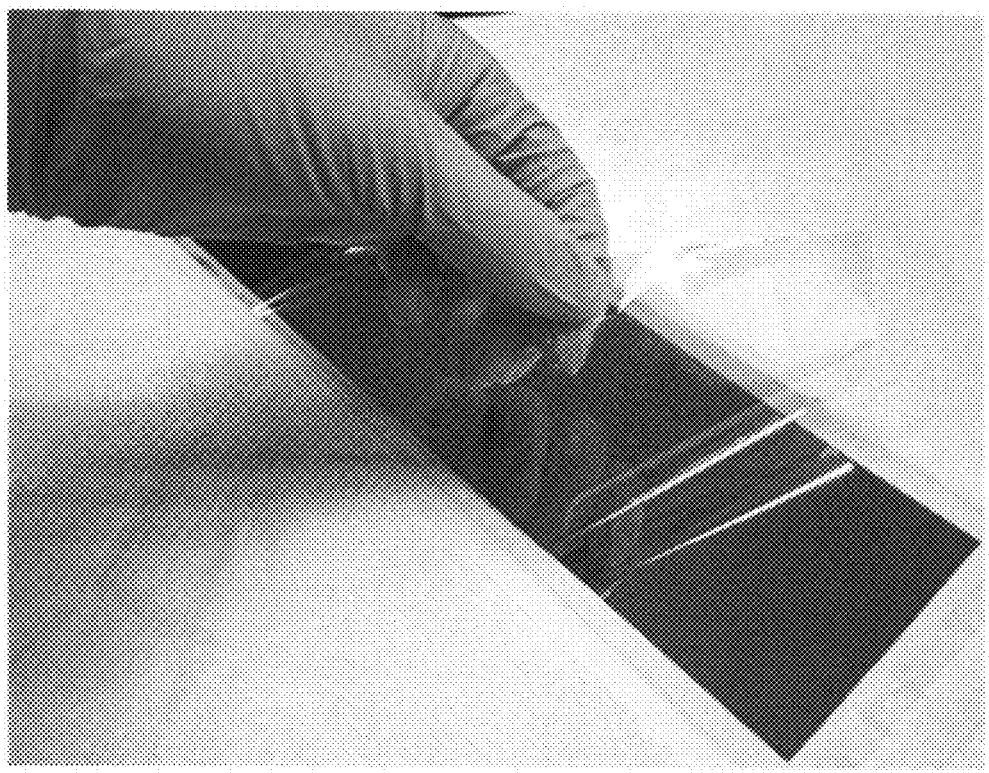
FIG. 5 illustrates a photograph of a flexible display device that is separable from a heat generator and a carrier substrate.

FIG. 5 shows a photograph of a flexible display device that is separable from a heat generator and a carrier substrate. The heat penetration depth of the polyimide film measured during this process is less than 0.5 μm. The ratio of the heat penetration depth to the entire polyimide film is very small, so when the Joule heating temperature is high enough to melt the flexible substrate, no thermal or mechanical damage occurs in the driving circuit and the light emitting element.

Figure 6:
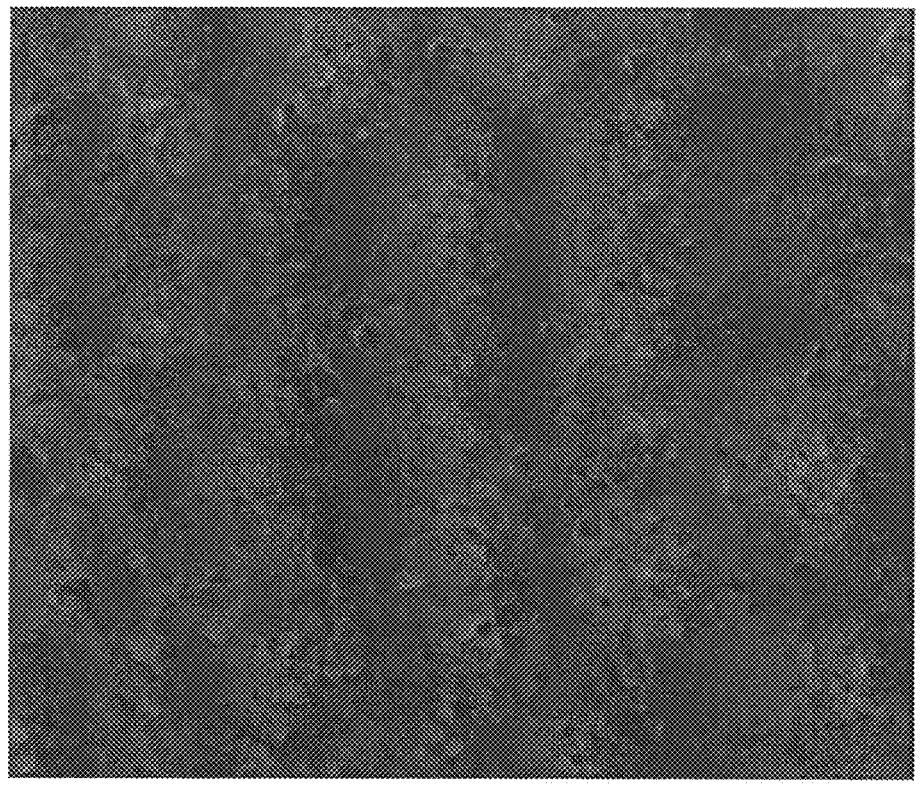
FIG. 6 illustrates a scanning electron microscope (SEM) photograph for indicating a surface of a flexible substrate in a flexible display device according to an exemplary embodiment.
Figure 7:
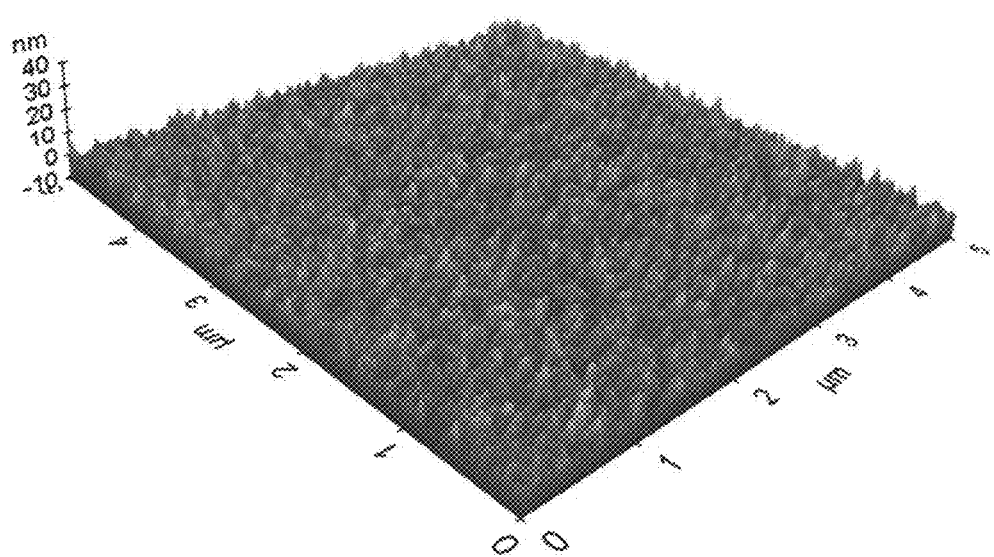
FIG. 7 and FIG. 8 illustrate atomic force microscope (AFM) photographs for indicating a surface of a flexible substrate in a flexible display device according to an exemplary embodiment.
Figure 8:
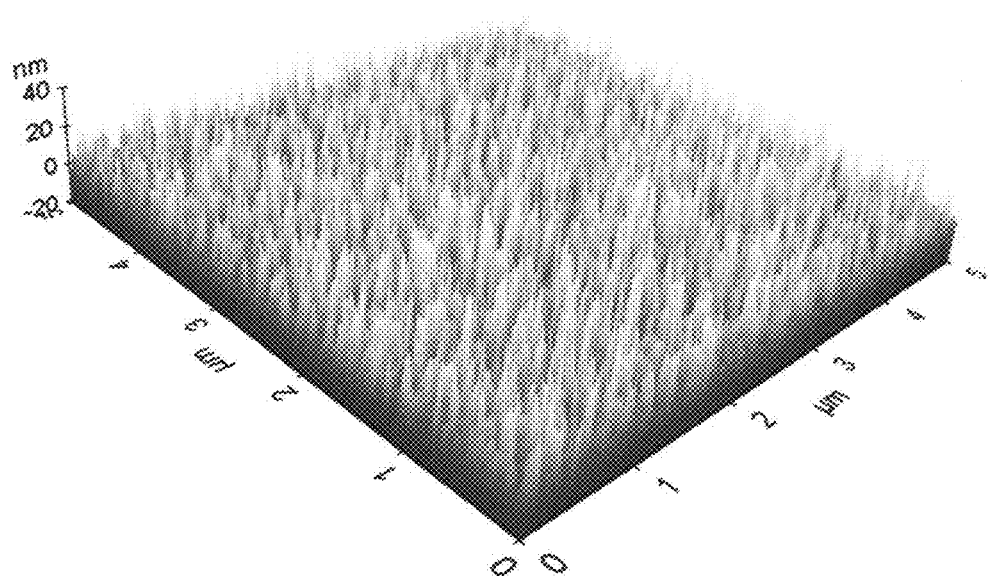

FIG. 6 shows a scanning electron microscopy (SEM) photograph of the surface of the flexible substrate 210 for the flexible display device 200 that is finished through the above-described process according to the first exemplary embodiment, and FIGS. 7-8 show atomic force microscopy (AFM) photographs of the same.

The surface of the flexible substrate shown in FIG. 6 to FIG. 8 indicates an outer surface of the flexible substrate that is separated from the heat generator 120 by generation of Joule's heat after the contact with the heat generator 120. In the case of the flexible display device 201 according to the second exemplary embodiment, the surface of the sacrificial layer 21 also has the same characteristic as FIG. 6 and FIG. 7. Magnification of FIG. 6 is 130,000 times.

Figure 9:
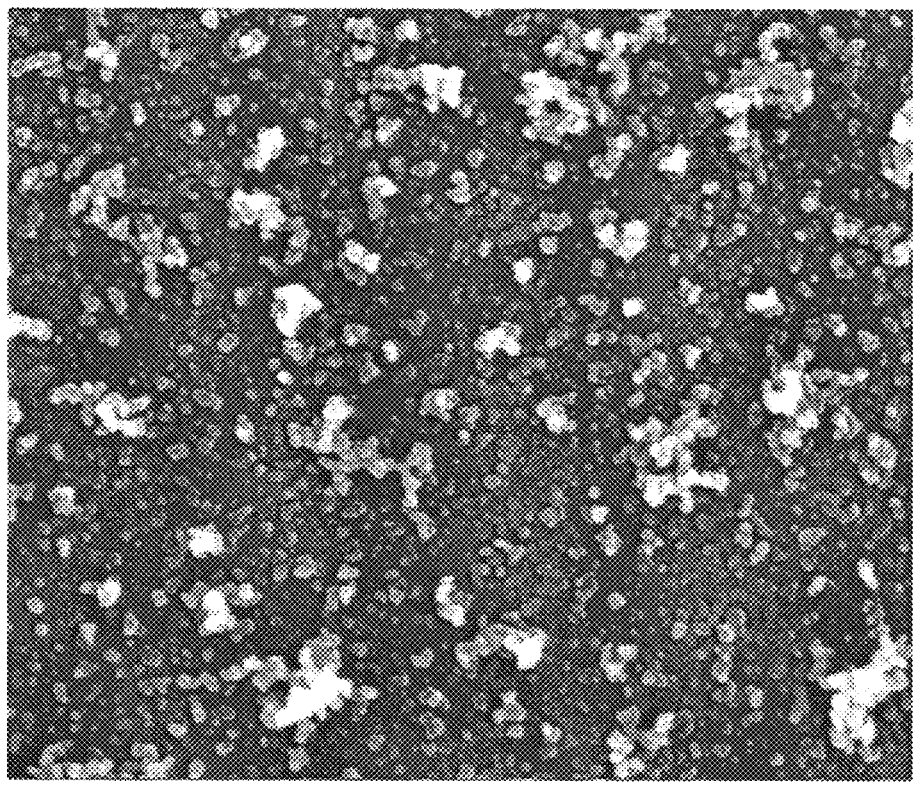
FIG. 9 illustrates a SEM photograph for indicating a surface of a flexible substrate in a flexible display device of a comparative example to which a laser scan process is applied.
Figure 10:
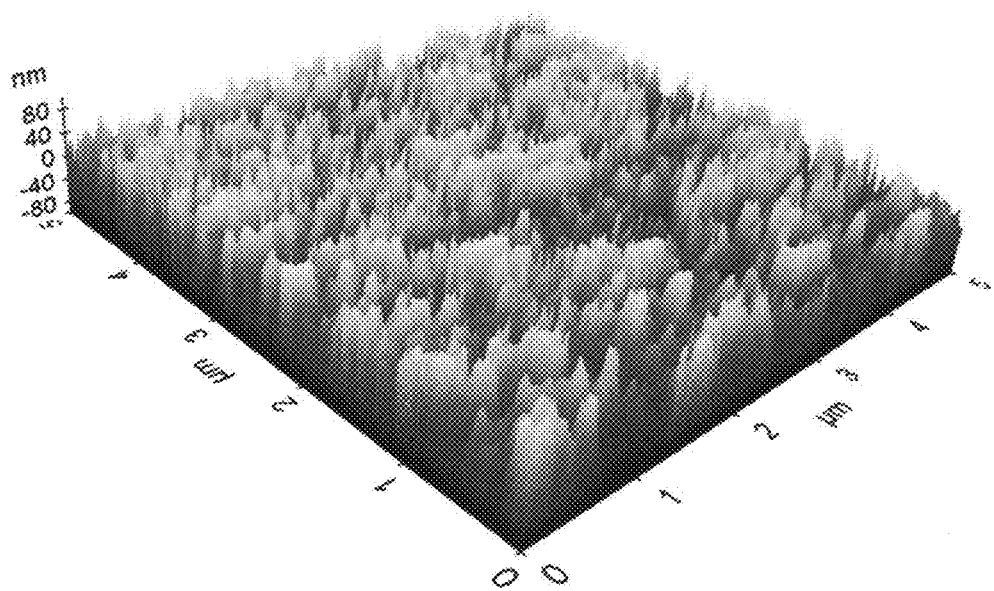
FIG. 10 illustrates an AFM photograph for indicating a surface of a flexible substrate in a flexible display device of a comparative example to which a laser scan process is applied.

A flexible display device according to a comparative example, i.e., a laser scan process applied to heat the flexible substrate is prepared, and FIG. 9 and FIG. 10 show a SEM photograph and an AFM photograph of the surface of the flexible substrate in the flexible display device according to the comparative example, respectively. The surface of the flexible substrate shown in FIG. 9 and FIG. 10 represents an outer surface of the flexible substrate separated from the carrier substrate by the laser beams after a contact with the carrier substrate. Magnification of FIG. 9 is 130,000 times.

The flexible display device according to the comparative example is manufactured with the same process as the flexible display device according to the present exemplary embodiment, with the exception of forming a flexible substrate other than a heat generator on the carrier substrate and scanning laser beams toward the flexible substrate from the outer part of the carrier substrate to separate the carrier substrate and the flexible substrate.

Referring to FIG. 6 to FIG. 8, regarding the flexible display device using the JILO process according to the first exemplary embodiment, the flexible substrate is realized to have a very uniform surface with much less roughness. The surface characteristic is caused by the JILO process characteristic in which the entire surface of the flexible substrate is simultaneously separated from the carrier substrate by instant thermal decomposition.

Regarding the flexible display device according to the present exemplary embodiment, root mean squared (RMS) roughness of the flexible substrate surface, e.g., outer part of the flexible substrate 210, is within the range of 1 nm to 15 nm. The RMS roughness of the flexible substrate is variable by many factors, such as a flexible substrate type, heat generator resistance, heating temperature, and a pulse period of the voltage applied to the heat generator, and it is commonly greater than about 1 nm and is less than about 15 nm. The RMS roughness of the flexible substrate measured by the AFM analysis of FIG. 7 is substantially about 2.5 nm, and the roughness of the RMS of the flexible substrate measured by the AFM analysis of FIG. 8 is substantially about 7.5 nm.

Referring to FIG. 9 and FIG. 10, in the flexible display device using the laser scanning process according to the comparative example, the flexible substrate has RMS roughness that is greater than 20 nm, and it realizes a surface that is rougher and less uniform than the flexible substrate according to the present exemplary embodiment. The RMS roughness of the flexible substrate surface measured by the AFM surface shown in FIG. 10 is substantially about 30 nm.

The surface characteristic of the flexible substrate according to the comparative example depends on the laser scan characteristic in which the depth of thermal decomposition of the flexible substrate is not constant because its precision has a limit when the intensity of the laser beams and the focal depth are controlled, and the characteristic in which the surface of the flexible substrate is sequentially (i.e., partially) thermally decomposed in the laser scan direction.

Figure 11:
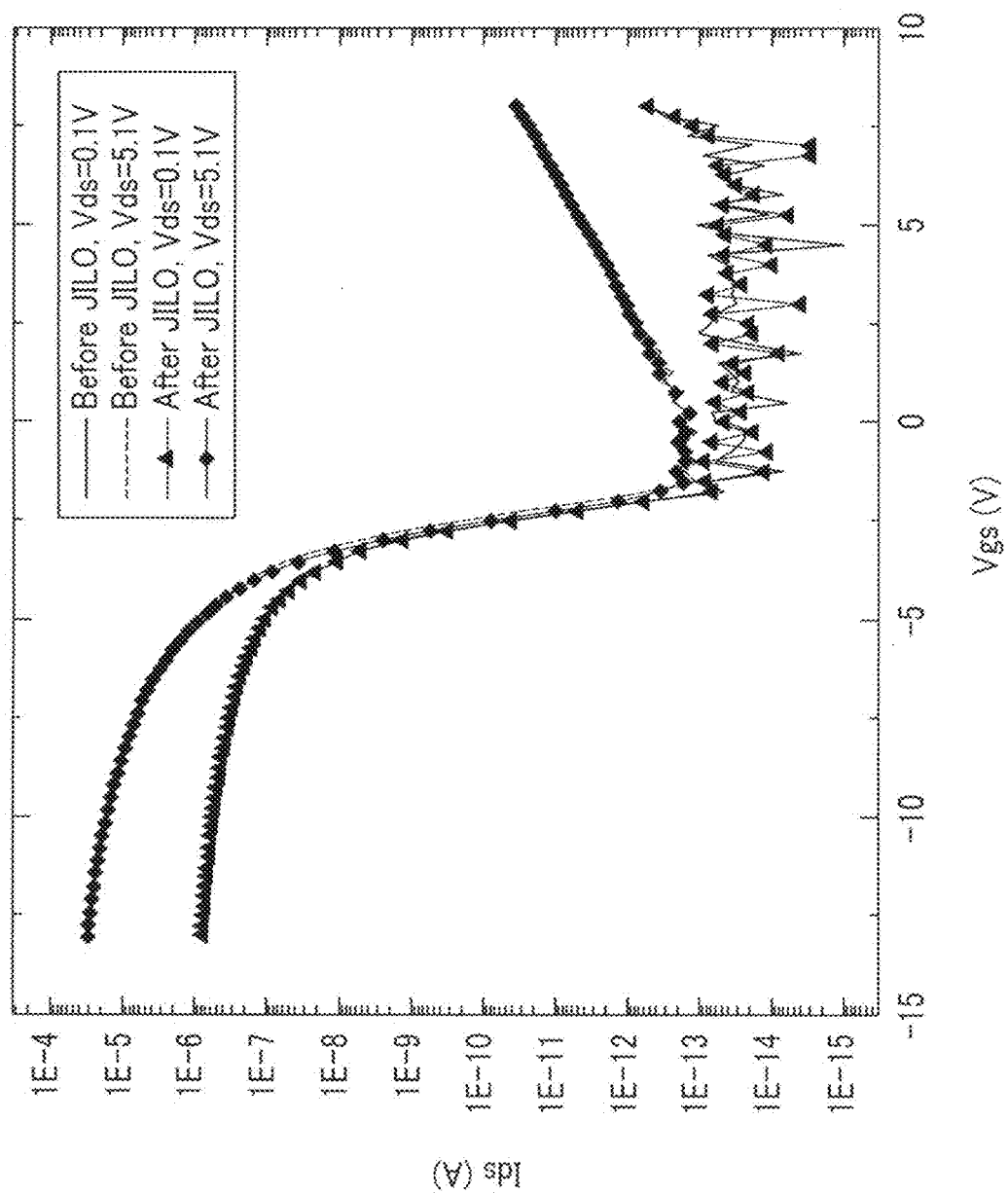
FIG. 11 illustrates a graph for indicating a transfer characteristic of a thin film transistor before/after a Joule heating induced lift-off (JILO) process.

A change of the characteristic of the thin film transistor before and after the JILO process in the flexible display device according to the present exemplary embodiment will now be described. Table 1 shows a characteristic of a thin film transistor measured before the JILO process is performed, and FIG. 11 shows a graph for indicating a transfer characteristic of the thin film transistor before and after the JILO process is performed.

TABLE 1

| | |
|---|---|
| $I_{on/off}$ rate | $>10^8$ |
| Threshold voltage (V) | −2.9 |
| Charge mobility (cm$^2$/Vsec) | 90.4 |
| s-slope (V/decade) | 0.32 |
| $I_{on}$ (μA/μm) | 3.5 |
| $I_{off}$ (pA) | 2.7 |

Before the JILO process, the charge mobility (μFET) of the thin film transistor is measured as 90.4 cm$^2$/Vsec, the threshold voltage as −2.9 V, and the s-slope (i.e., sub-threshold slope) as 0.32 V/decade. After the JILO process, as shown in FIG. 11, it is checked that the threshold voltage of the thin film transistor and the s-slope are not changed. The above-described result signifies that the JILO process does not impart meaningful damage to the thin film transistor performance.

Figure 12:
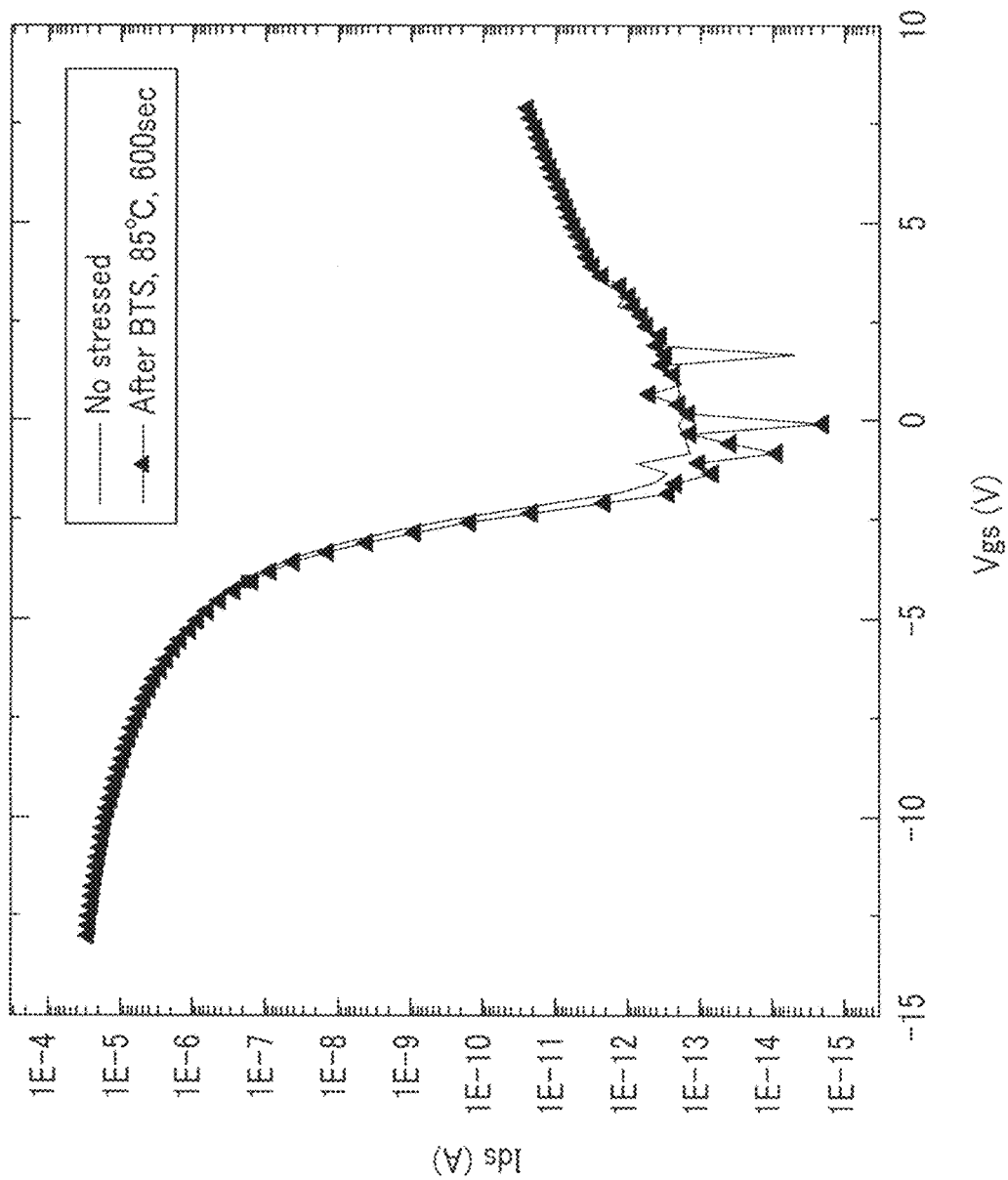
FIG. 12 illustrates a graph for indicating a transfer characteristic of a thin film transistor after a JILO process according to a bias temperature stress (BTS) test.

FIG. 12 shows a graph, which is a bias temperature stress (BTS) test result, for indicating the transfer characteristic of the thin film transistor after the JILO process is performed. The BTS test is performed under the bias stress conditions of Vg=15 V, 600 seconds, and 85° C.

Referring to FIG. 12, a threshold voltage move of 0.1 V is observed in the bias stress condition at Vds=5.1 V and 0.1 V compared to the case before-stress. The value is similar to the general low temperature poly-silicon (LTPS) thin film transistor formed on the glass substrate. Then, the JILO process imparts little influence to the reliability of the thin film transistor.

Figure 13A:
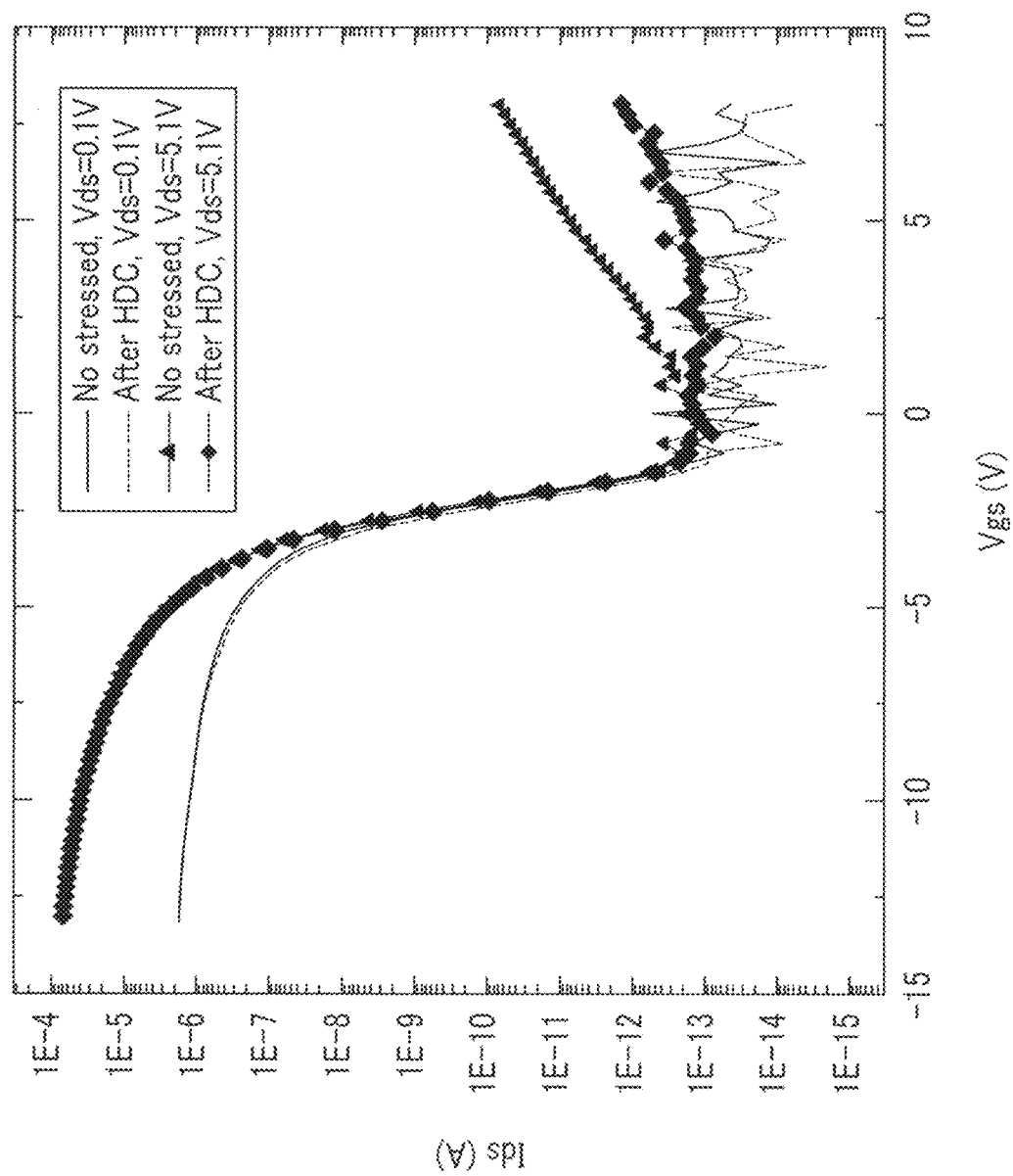
FIG. 13A illustrates a graph for indicating a transfer characteristic of a thin film transistor after a JILO process according to a high drain current (HDC) stress test.
Figure 13B:
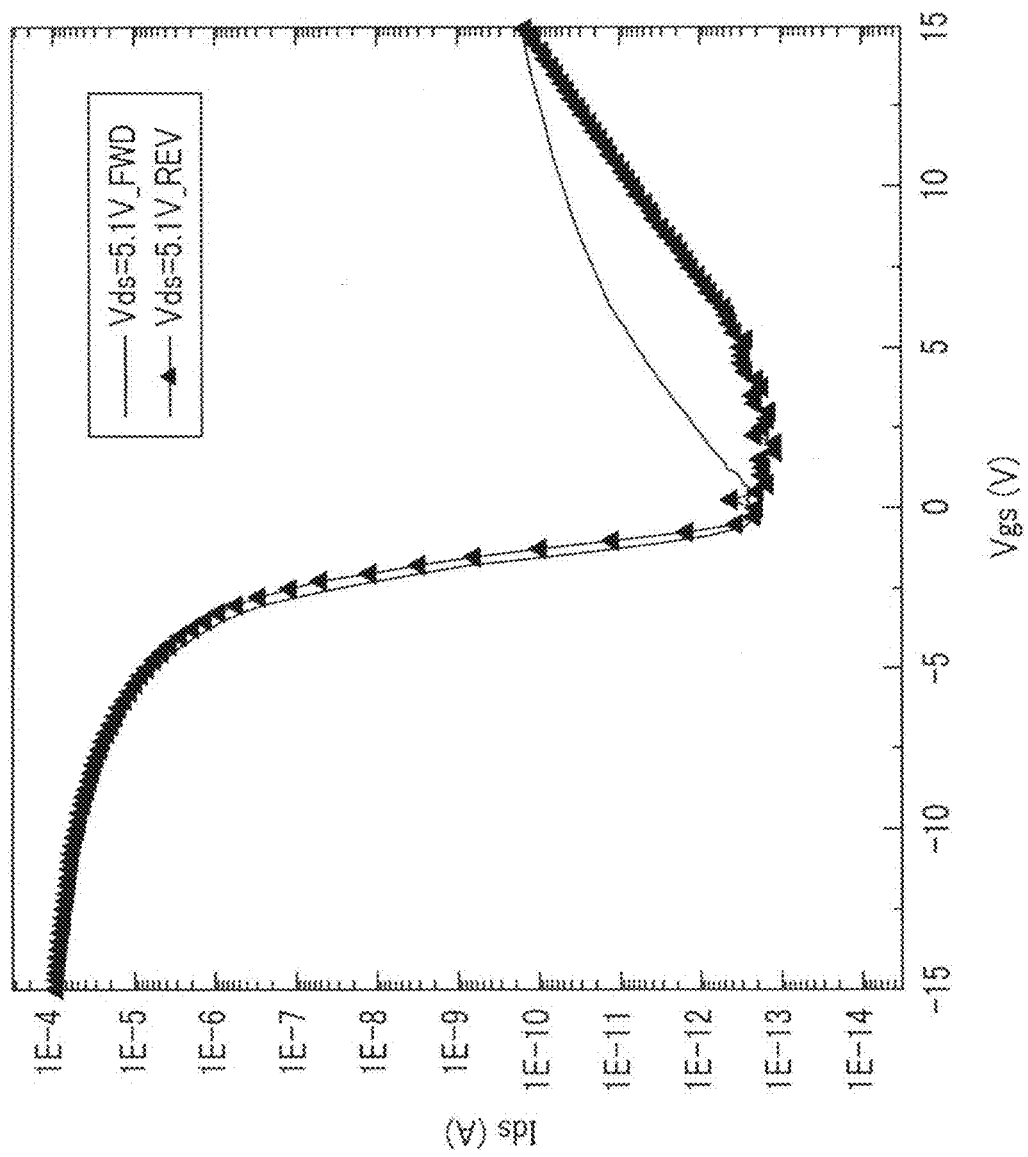
FIG. 13B illustrates a graph for indicating hysteresis of a thin film transistor after a JILO process.

FIG. 13A shows a graph for indicating a transfer characteristic of the thin film transistor after the JILO process is performed, showing a high drain current (HDC) stress test result. FIG. 13B shows a graph for indicating hysteresis of a thin film transistor after the JILO process is performed.

In FIG. 13A, the HDC stress conditions are Vgs=(−15V), Vds=(−20V), and 60 seconds. It is determined from the result of FIG. 13A that no change is imparted to the electric characteristic of the thin film transistor after the HDC stress. Also, in FIG. 13B, the threshold voltage move after the JILO process is substantially 0.2 V, which is very similar to the general LTPS thin film transistor.

It is found from the above-described test results that the JILO skill according to the present exemplary embodiment does not influence the performance and the reliability of the thin film transistor and it is suitable for mass production.

Figure 14:
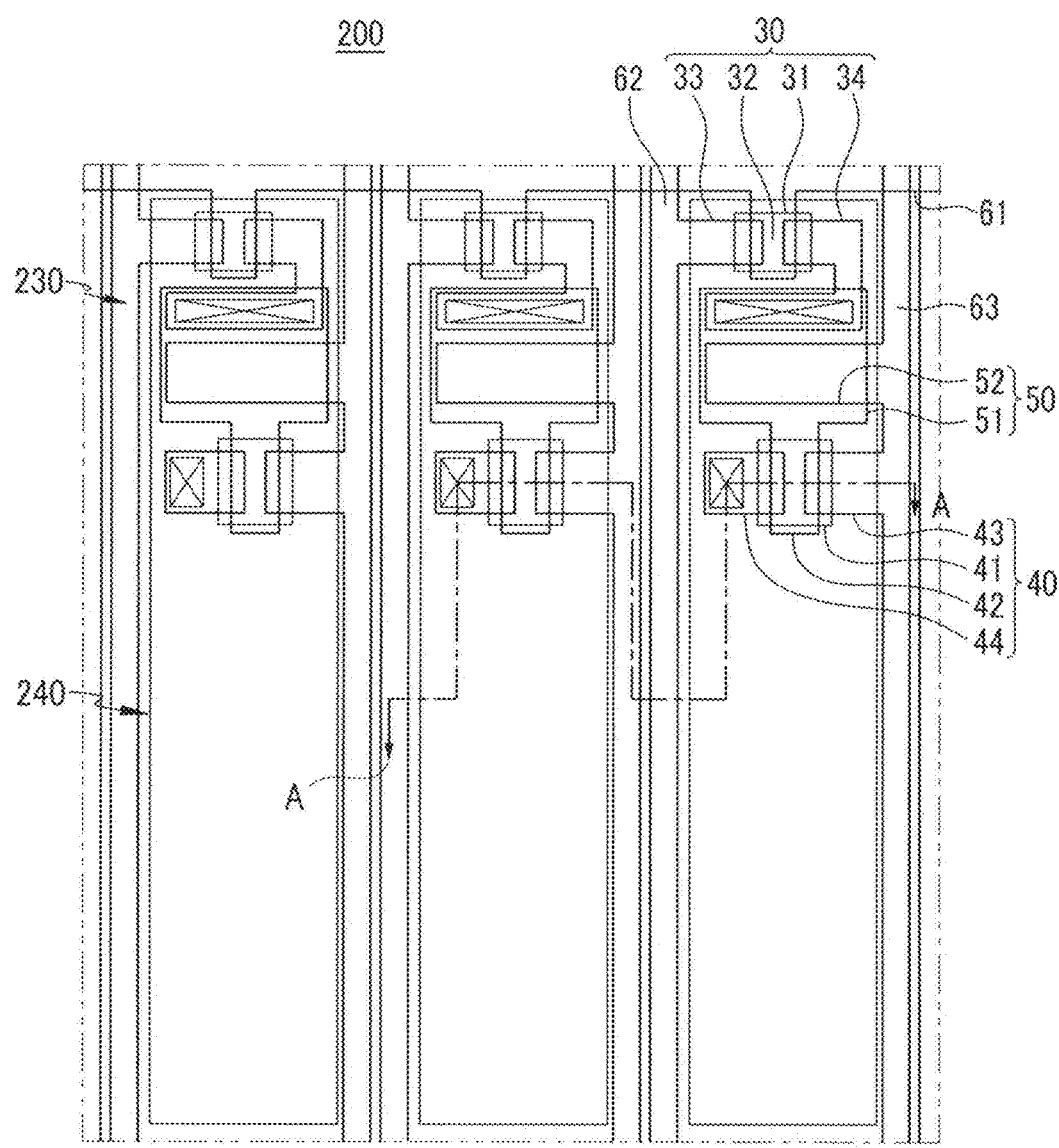
FIG. 14 illustrates a layout of a pixel configuration of a flexible display device.
Figure 15:
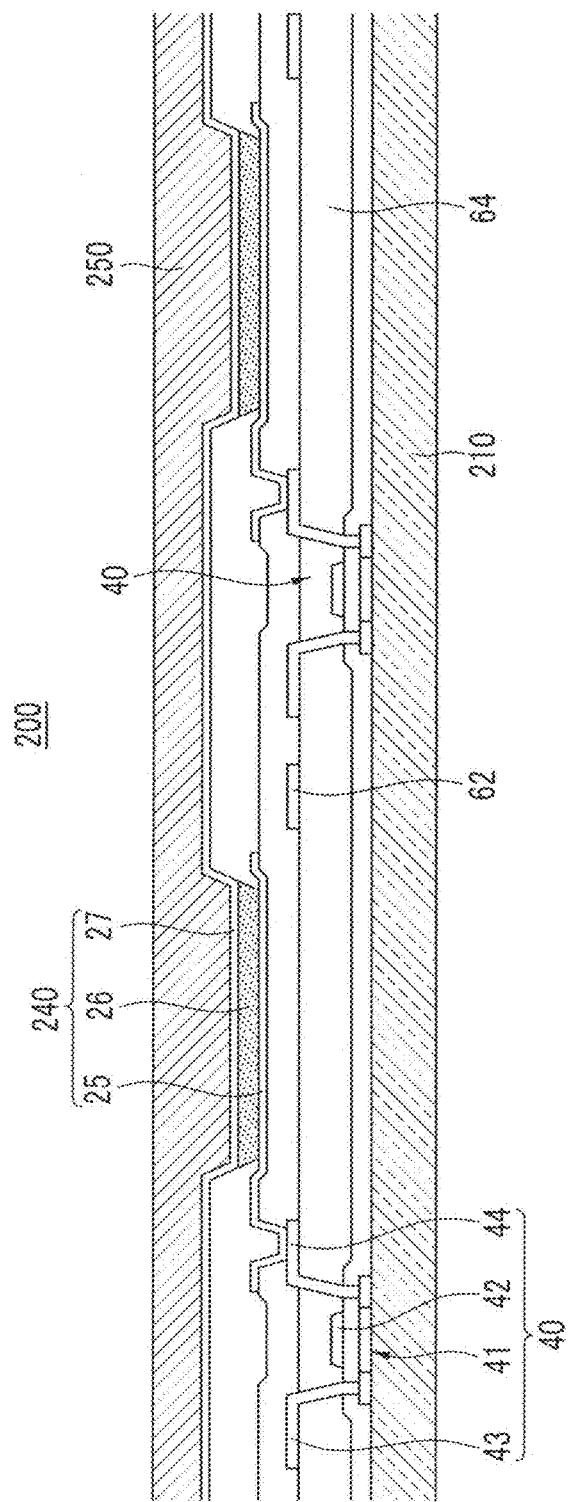
FIG. 15 illustrates a cross-sectional view along line A-A of FIG. 14.

Referring to FIG. 14 and FIG. 15, an internal configuration of the flexible display device will now be described.

FIG. 14 shows a layout view of a pixel configuration of a flexible display device, and FIG. 15 shows a cross-sectional view of a flexible display device with respect to line A-A of FIG. 14. FIG. 14 and FIG. 15 show an OLED display as a detailed example of the flexible display device.

Referring to FIG. 14 and FIG. 15, the flexible display device 200 formed according to the first exemplary method may include a plurality of pixels, of which each has a driving circuit 230 and an organic light emitting element 240. The driving circuit 230 includes a switching thin film transistor 30, a driving thin film transistor 40, and a capacitor 50. A gate line 61 is provided in one direction of the flexible substrate 210, and the data line 62 and the common power line 63 cross the gate line 61 in an insulated manner.

FIG. 14 exemplifies a pixel having two thin film transistors 30 and 40, and a capacitor 50. Further, the flexible display device 200 can have three or more thin film transistors and two or more capacitors for each pixel, and can further have an additional wire for various configurations.

The switching thin film transistor 30 includes a switching semiconductor layer 31, a switching gate electrode 32, a switching source electrode 33, and a switching drain electrode 34. The driving thin film transistor 40 includes a driving semiconductor layer 41, a driving gate electrode 42, a driving source electrode 43, and a driving drain electrode 44. A bottom gate structured thin film transistor can be used for the thin film transistor as well as the top gate structured thin film transistor shown in FIG. 15.

The capacitor 50 includes a pair of capacitor plates 51 and 52 disposed with an interlayer insulating layer 64 therebetween. In this instance, the interlayer insulating layer 64 is formed with a dielectric material. Capacitance is determined by the charges charged in the capacitor 50 and a voltage between the capacitor plates 51 and 52.

The organic light emitting element 240 includes a pixel electrode 25, an organic emission layer 26 formed on the pixel electrode 25, and a common electrode 27 formed on the organic emission layer 26. The pixel electrode 25 can be a hole injection electrode, and the common electrode 27 can be an electron injection electrode. The opposite can be allowable depending on the method for driving the flexible display device 200. The holes and the electrons are injected into the organic emission layer 26 from the pixel electrode 25 and the common electrode 27. Lights emitted when excitons, i.e., combinations of the injected holes and electrons, enter a ground state from an exited state.

A reflective electrode is used for the pixel electrode 25, and a transparent or semitransparent electrode is used for the common electrode 27. In this case, the organic light emitting element 240 emits light to the encapsulation member 250. A transparent or semitransparent electrode is used for the pixel electrode 25, and a reflective electrode is used for the common electrode 27. In this case, the organic light emitting element 240 imparts light to the flexible substrate 210.

The switching thin film transistor 30 is used as a switch for selecting a pixel to emit light. The switching gate electrode 32 is connected to the gate line 61. The switching source electrode 33 is connected to the data line 62. The switching drain electrode 34 is disposed to be separated from the switching source electrode 33 and is connected to one capacitor plate 51.

The driving thin film transistor 40 applies drive power for emitting the organic emission layer 26 of the organic light emitting element 240 within the selected pixel to the pixel electrode 25. The drive gate electrode 42 is connected to the capacitor plate 51 connected to the switching drain electrode 34. The drive source electrode 43 and the other capacitor plate 52 are connected to the common power line 63. The drive drain electrode 44 is connected to the pixel electrode 25 of the organic light emitting element 240 through a contact hole.

According to the described configuration, the switching thin film transistor 30 is operated by the gate voltage applied to the gate line 61 to transmit the data voltage applied to the data line 62 to the driving thin film transistor 40. A voltage corresponding to a difference between the common voltage applied to the driving thin film transistor 40 from the common power line 63 and the data voltage transmitted by the switching thin film transistor 30 is stored in the capacitor 50, and a current corresponding to the voltage stored in the capacitor 50 flows to the organic light emitting element 240 to emit light.

According to example embodiments, the carrier substrate and the flexible substrate may be easily separated within a short time, e.g., several microseconds ($\mu s$), and no thermal and/or mechanical damage may be imparted to the thin film transistor and light emitting element on the flexible substrate. The separation technique is appropriate for manufacturing a wide-area flexible display device by mass production. Further, the flexible display device may be manufactured by using the existing manufacturing system, thereby avoiding difficulties and costs of providing a new manufacturing system.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method for manufacturing a flexible display device, the method comprising:
    forming a heat generator on a carrier substrate;
    forming a flexible substrate on a first surface of the heat generator, the flexible substrate being smaller than the heat generator such that at least first and second opposing ends of the heat generator extend beyond the flexible substrate, the heat generator having a surface area overlapping the flexible substrate greater than a surface area of the flexible substrate;
    forming a thin film transistor on the flexible substrate;
    forming a light emitting element connected to the thin film transistor; and
    separating the flexible substrate from the heat generator by applying heat to the flexible substrate, applying the heat including generating uniform heat over the whole heat generator by supplying a voltage to the first surface of the heat generator, wherein separating the flexible substrate from the heat generator includes applying the heat that provides an interface temperature between the heat generator and the flexible substrate that is greater than a melting point of the flexible substrate so that a part of the flexible substrate is decomposed by the heat.

2. The method as claimed in claim 1, wherein forming the flexible substrate includes forming a single layer on the heat generator.

3. The method as claimed in claim 1, wherein forming the flexible substrate includes:
    forming a sacrificial layer on the heat generator;
    forming a water vapor permeation preventing layer on the sacrificial layer; and
    forming a main body layer on the water vapor permeation preventing layer.

4. The method as claimed in claim 3, wherein separating the sacrificial layer from the heat generator includes applying heat that provides an interface temperature between the heat generator and the sacrificial layer that is greater than a melting point of the sacrificial layer.

5. A flexible display device manufactured by the method of claim 1, an outer part of the flexible substrate having a root mean squared roughness in a range from about 1 nm to about 15 nm.

6. A method for manufacturing a flexible display device, the method comprising:
- forming a heat generator on a carrier substrate, the heat generator including a conducting material with a predetermined resistance;
- forming a flexible substrate on a first surface of the heat generator, the flexible substrate being smaller than the heat generator so as to form at least first and second exposed ends of the heat generator, the exposed ends extending beyond the flexible substrate, the heat generator having a surface area overlapping the flexible substrate greater than a surface area of the flexible substrate;
- forming a driving circuit including a thin film transistor on the flexible substrate;
- forming a light emitting element and an encapsulation member on the driving circuit; and
- generating Joule's heat by applying a voltage to the first surface of the heat generator at least one of the first and second exposed ends of the heat generator, the generated uniform Joule's heat over the whole heat generator being applied to the flexible substrate to separate the flexible substrate from the heat generator, wherein separating the flexible substrate from the heat generator includes applying the heat that provides an interface temperature between the heat generator and the flexible substrate that is greater than a melting point of the flexible substrate so that a part of the flexible substrate is decomposed by the heat.

7. The method as claimed in claim 6, wherein forming the heat generator includes depositing at least one of a metal and a metal oxide to a uniform thickness on the carrier substrate.

8. The method as claimed in claim 7, wherein generating the Joule's heat includes applying to at least one of the first and second exposed ends of the heat generator voltage with a pulse waveform.

9. The method as claimed in claim 6, wherein forming the flexible substrate includes forming a single layer on the heat generator, such that a predetermined part of the single layer contacting the heat generator is decomposed by the Joule's heat of the heat generator.

10. The method as claimed in claim 9, wherein the flexible substrate includes at least one of polyimide, polycarbonate, polyacrylate, polyetherimide, polyethersulphone, polyethylene terephthalate, or polyethylene naphthalate.

11. The method as claimed in claim 10, wherein generating the Joule's heat includes heating the heat generator to a temperature of about 300° C. to about 900 ° C.

12. The method as claimed in claim 6, wherein forming the flexible substrate includes:
- forming a sacrificial layer on the heat generator;
- forming a water vapor permeation preventing layer on the sacrificial layer; and
- forming a main body layer on the water vapor permeation preventing layer.

13. The method as claimed in claim 12, wherein the sacrificial layer is formed to be thinner than the main body layer, at least a part of the sacrificial layer being decomposed by the Joule's heat of the heat generator so the water vapor permeation preventing layer and the main body layer are separated from the heat generator.

14. The method as claimed in claim 13, wherein
the sacrificial layer is formed of at least one of polyimide, polycarbonate, polyacrylate, polyetherimide, polyethersulphone, polyethylene terephthalate, or polyethylene naphthalate.

15. The method as claimed in claim 14, wherein the Joule heating temperature of the heat generator is within the range of about 300° C. to about 900° C.

16. The method of claim 6, wherein the light emitting element includes a plurality of organic light emitting elements.

17. The method of claim 16, wherein the encapsulation member includes multiple layers including a plurality of organic layers and a plurality of inorganic layers.

18. A flexible display device manufactured by the method of claim 6, an outer part of the flexible substrate having a root mean squared roughness of about 1 nm to about 15 nm.

19. A method for manufacturing a flexible display device, the method comprising:
- forming a heat generator on a carrier substrate, the heat generator including a conducting material with a predetermined resistance;
- forming a single layer on the heat generator,
- forming a flexible substrate on the single layer, the flexible substrate and single layer each being smaller than the heat generator such that at least first and second opposing ends of the heat generator extend beyond the flexible substrate, the heat generator having a surface area overlapping the flexible substrate greater than a surface area of the flexible substrate;
- forming a thin film transistor on the flexible substrate;
- forming a light emitting element connected to the thin film transistor; and
- separating the flexible substrate from the heat generator by applying heat to the flexible substrate, applying the heat including generating uniform heat over the whole heat generator by supplying a voltage to the single layer on the heat generator such that a predetermined part of the single layer contacting the heat generator is decomposed by the heat of the heat generator, wherein separating the flexible substrate from the heat generator includes applying the heat that provides an interface temperature between the heat generator and the flexible substrate that is greater than a melting point of the flexible substrate so that a part of the flexible substrate is decomposed by the heat.

* * * * *